United States Patent [19]

Whight

[11] Patent Number: 4,573,066
[45] Date of Patent: Feb. 25, 1986

[54] BREAKDOWN VOLTAGE INCREASING DEVICE WITH MULTIPLE FLOATING ANNULAR GUARD RINGS OF DECREASING LATERAL WIDTH

[75] Inventor: Kenneth R. Whight, Horsham, England

[73] Assignee: U.S. Philips Corporation, New York, N.Y.

[21] Appl. No.: 558,409

[22] Filed: Dec. 5, 1983

[30] Foreign Application Priority Data

Dec. 3, 1982 [GB] United Kingdom ............... 8234609

[51] Int. Cl.⁴ .......................................... H01L 29/06
[52] U.S. Cl. ....................................... 357/52; 357/20
[58] Field of Search ........................... 357/20, 52, 38

[56] References Cited

U.S. PATENT DOCUMENTS 3,391,287  7/1968  Kao et al. .......................... 357/38
3,971,061  7/1976  Matsushita et al. ................ 357/38
4,003,072  1/1977  Matsushita et al. ................ 357/52

OTHER PUBLICATIONS

T. Matsushita et al., "New Semi. Devices of Ultra-High Breakdown Volt," 1973 IEDM, pp. 109-110, Washington, D.C.

Y. Kao et al., "High-Voltage Planar P-N Jcns.," Proc. IEEE, vol. 55 #8, Aug. 1967, pp. 1409-1414.

Primary Examiner—Joseph E. Clawson, Jr.
Attorney, Agent, or Firm—Robert T. Mayer; Steven R. Biren

[57] ABSTRACT

In order to increase the breakdown voltage of a reverse-biased p-n junction of a semiconductor device, at least three annular regions which extend around the active device region are located within the spread of a depletion layer from the junction. At least one inner annular region is wider than outer annular regions, and this increased width of the inner region or regions reduces peak electrostatic fields found to occur at the bottom outer corners of the active device region and inner annular regions. The spacing of the annular regions increases with remoteness from the active device region, although at least two inner annular regions may have the same spacing as that of the innermost annular region from the active device region. A group of annular regions may have the same width as each other in the group.

9 Claims, 3 Drawing Figures

BREAKDOWN VOLTAGE INCREASING DEVICE WITH MULTIPLE FLOATING ANNULAR GUARD RINGS OF DECREASING LATERAL WIDTH

BACKGROUND OF THE INVENTION

The invention relates to semiconductor devices, for example rectifier diodes, field-effect transistors, bipolar transistors and thyristors, having a p-n junction which is operated under reverse bias in at least one mode of operation of the device.

The article entitled "High Voltage Planar P-N Junctions" by Y. C. Kao and E. D. Wolley in the "Proceedings of the I.E.E.E.", Vol. 55, No. 8, August 1967, pages 1409 to 1414 describes semiconductor devices having a concentric field-limiting planar junction structure to increase the breakdown voltage. These devices comprise a semiconductor body having a portion of one conductivity type adjoining a major surface of the body. An active device region of the opposite conductivity type also adjoins said major surface and forms with said portion a main p-n junction which terminates at said major surface and which is operated under reverse bias in at least one mode of operation of the device. At least three annular regions of said opposite conductivity type extend around said active device region. These annular regions also adjoin said major surface and form with said portion auxiliary p-n junctions located within the spread of a depletion layer from the reverse-biased main p-n junction so as to increase the breakdown voltage of the main p-n junction. The spacing between two outer annular regions which are remote from the active device region is larger than the spacing between the active device region and an inner annular region which is adjacent the active device region. Said active device region and said annular regions are more highly doped than said portion of the body.

It is stated in the Proc. I.E.E.E. article that in the absence of the annular regions, a significantly higher electric field occurs at the surface-terminating portion of the (main) p-n junction than at the bulk portion which extends parallel to the surface, so resulting in avalanche breakdown of the p-n junction at the surface. The provision of the annular regions reduces the field at the surface so that breakdown does not occur until a higher voltage level which is comparable with the plane breakdown voltage of the bulk portion of the junction. The annular regions are spaced such that, at a voltage considerably less than the breakdown voltage of the bulk portion of the main junction, the space charge region of the main junction punches through to the first annular region. After the punch-through, further increases in voltage are largely taken up by the first annular region as the carriers are depleted on the outside of the annular region junction. The maximum electric field occurring across the main junction adjacent the surface is determined by the punch-through voltage and so can be controlled to be considerably less than the critical field, by adjusting the spacings. Thus the annular regions act like voltage dividers with the voltage between the main junction and the annular regions being a function of the spacing.

As illustrated in FIG. 3 of said Proc. I.E.E.E. article, in the devices fabricated and studied by Kao and Wolley the spacing between adjacent annular regions is larger remote from the active device region than adjacent the active device region. As stated in said article, this variable spacing was selected in order to study variation of punch-through voltage on a single structure. However it has subsequently been found that by varying the spacing in this manner a higher breakdown voltage can be achieved compared with a concentric annular structure of uniform spacing. All the annular regions of each individual device are of uniform width; Kao and Wooley state in the related U.K. Patent Specification (GB) No. 1,138,237A that their width is not important and can be made as narrow as feasible in order to retain as much area on the semiconductor body as possible for the main p-n junction. All the annular regions of each individual device described in GB No. 1,138,237A are also of uniform width.

SUMMARY OF THE INVENTION

The present invention is based on a surprising discovery that the width of the annular regions (as well as their spacing) is important for optimizing the voltage performance.

Thus, according to the present invention, there is provided a semiconductor device comprising a semiconductor body having a portion of one conductivity type adjoining a major surface of the body, an active device region of the opposite conductivity type also adjoining said major surface and forming with said portion a main p-n junction which terminates at said major surface and is operated under reverse bias in at least one mode of operation of the device, and at least three annular regions of said opposite conductivity type extending around said active device region, which annular regions also adjoin said major surface and form with said portion auxiliary p-n junctions located within the spread of a depletion layer from the reverse-biased main p-n junction so as to increase the breakdown voltage of the main p-n junction, the spacing between two outer annular regions which are remote from the active device region being larger than the spacing between the active device region and the inner annular region which is adjacent the active device region, said active device region and said annular regions being more highly doped than said portion of the body, characterised in that the inner annular region which is adjacent the active device region is wider than said two outer annular regions which are remote from the active device region.

Surprisingly, it has been found that by having at least one wider inner annular region adjacent the active device region a higher percentage of the plane breakdown voltage can be achieved while the total surface area of the body occupied by the concentric annular region structure can be reduced by having narrower annular regions remote from the active device region. It is believed that the increase in breakdown voltage is related to a reduction in curvature of the equipotential surfaces in the depletion layer adjacent the outer bottom corner of the active device region and the inner annular region(s) so reducing the electrostatic field due to the field lines being stretched apart by the larger width of the inner annular region(s). The effect is particularly important for shallow regions, for example when the main and auxiliary junctions extend to a depth of about 5 microns or less from the major surface of the body. For a given spacing between the regions, shallow regions introduce more curvature into the equipotential surfaces, thus increasing the field strengths and reducing the breakdown voltage.

The number, widths and spacings of the annular regions depend on the desired breakdown voltage. Three annular regions may be sufficient for some low voltage devices, the inner annular region being wider than the two outer annular regions. Usually more than three annular regions will be provided, especially for devices with shallow junctions. Thus, as junction depth is reduced, a larger number of annular regions are normally required to support a given voltage. For example a device having a breakdown voltage in excess of 500 volts and having a depth of about 3 micrometers for the main and auxiliary p-n junctions may have a series of at least 4 or more concentric annular regions. Especially for shallow junctions, in order to reduce curvature of the equipotential surfaces while obtaining a compact structure, the width of the inner(most) annular region may be at least six or more times the spacing of the innermost annular region from the active device region, more than seven times its depth, and at least two or more times the width of an outer annular region. For higher voltage devices many more outer annular regions may be added and the width of the innermost annular region may be considerably increased. For example, a device having a breakdown voltage of at least 1,000 volts and a junction depth of about 3 micrometers, may have a series of between ten and fifteen annular regions, the innermost of which may have a width of more than fifteen times its spacing from the active device region, more than twelve times its depth, and more than six times the width of the outermost annular region.

The annular regions may comprise at least one group of at least two successive annular regions which have the same width as each other in the group. This simplifies design analysis of the annular regions and is particularly acceptable for a group of annular regions which are not immediately adjacent the active device region. Thus, between the active device region and the group of annular regions of the same width, there may be at least one innermost annular region which is wider than the regions of said group. The width of the one or more wider innermost regions can be individually chosen to optimize the stretching apart of the electrostatic field lines. However, for some devices it may be sufficient for the wider innermost annular regions to constitute a group having the same region width as each other but wider than the region width of the other group.

In order to control and optimize the breakdown voltage it is generally desirable to vary the spacing of the annular regions so that the spacing is larger remote from the active device region. Thus, the spacing between said two outer annular regions remote from the active device region is larger than the spacing between the active device region and the innermost annular region. However, preferably the innermost annular region is so wide that the spacing between said two outer annular regions is smaller (for example, a half or less) than the width of the innermost annular region. The spacing between outer annular regions which are remote from the active device region preferably increases progressively in accordance with remoteness from the active device region to optimize the spread of the depletion layer to these narrower remote annular regions. It has been found that, contrary to simple theory, relatively small changes in the spacing of these remote annular regions can even have a significant effect on the electrostatic field and avalanche breakdown at the junctions of the active device region and the inner annular regions. This is particularly useful where the close spacing of the inner annular regions from each other and from the active device region may be limited by technological constraints on reliably-reproducible smallest separation distances, for example as determined by lateral etching of juxtaposed mask windows and lateral diffusion of juxtaposed regions in technological processes commonly used to form such devices. Thus the same close spacing may be used for at least two annular regions near the active device region as well as the spacing between the active device region and the innermost annular region.

BRIEF DESCRIPTION OF THE DRAWING

Embodiments of the invention will now be described, by way of example, with reference to the accompanying drawing, in which.

DESCRIPTION OF THE PREFERRED EMBODIMENTS

Figure 1:
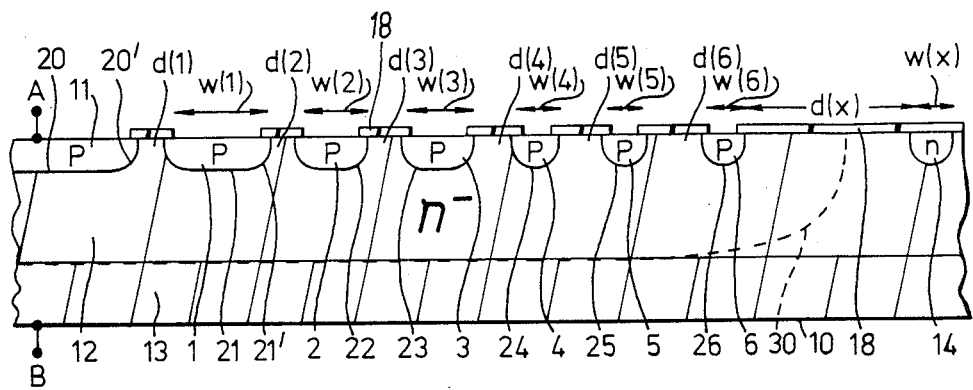
FIG. 1 is a diagrammatic cross-section through part of a semiconductor device in accordance with the present invention.

The semiconductor device of FIG. 1 comprises a semiconductor body 10 (for example of monocrystalline silicon) having a portion 12 of one conductivity type (n-type, in the example shown in the drawing) which adjoins the upper major surface of the body 10. An active device region 11 of the opposite conductivity type (p-type, in the example shown) also adjoins said upper major surface and forms with the body portion 12 a main p-n junction 20 which terminates at the upper major surface. The junction 20 is operated in reverse-bias in at least one mode of operation of the device, by applying a bias voltage between the electrodes A and B in FIG. 1.

Concentric annular regions 1 to 6 of said opposite conductivity type (p-type, in the example) extend around the active device region 11. These annular regions 1 to 6 also adjoin the upper major surface and form with the body portion 12 auxiliary p-n junctions 21 to 26 within the spread of a depletion layer 30 from the reverse-biased main p-n junction 20 so as to increase the breakdown voltage of the main junction 20. In FIG. 1 an example of a depletion layer 30 is shown as extending across the thickness of the body portion 12, although in some cases the depletion layer 30 may not extend so deeply from the junction 20.

The active device region 11 and annular regions 1 to 6 are more highly doped than the body portion 12 and may be formed by locally implanting or/and diffusing dopant of the opposite conductivity type (p-type) to locally overdope the body portion 12. FIG. 1 illustrates an insulating passivating layer 18 (for example of silicon dioxide) on the upper major surface of the body 10 and having openings serving as mask windows through which this local dopant introduction may be effected to form the regions 1 to 6 and 11. Depending on the type of device, a further insulating passivating layer may be provided in these openings to passivate exposed areas of the upper major surface of the body 10 except where contacted by electrodes. A highly doped channel-stopper region 14 of the same conductivity type as the body portion 12 extends in a concentric arrangement around the system of regions 1 to 6 and is formed by local dopant introduction in a separate step from the regions 11 and 1 to 6.

The annular regions 1 to 6 and 14 may be circular rings which have circular symmetry around the active device region 11 at the upper major surface of the body 10. However, other geometrical outlines are possible, depending on the outline of the active device region 11 and the type of the device. Thus, for example, the region 11 may have a square outline with straight sides but with rounded corners, and the concentric rings 1 to 6 and 14 may be similarly square with straight sides and rounded corners. Such different outlines and geometries are already known in the power semiconductor device art and so will not be described further in the present specification. For convenience and simplicity in the drawing, FIG. 1 merely shows a cross-section through part of the region structure 11, 1, 2, 3, 4, 5, 6 and 14 at the right-hand side of the active device region 11.

The basic device structure of FIG. 1 may be used for various types of semiconductor devices in accordance with the invention, for example a power rectifier diode, a high voltage bipolar transistor, a thyristor, or a high voltage insulated-gate field-effect transistor. For a power rectifier diode, the p-n junction 20 may constitute the rectifying junction, metal layers forming the electrodes A and B constitute the diode terminals, and the body portion 12 may be a high resistivity n-type substrate into which a highly-doped n-type layer 13 is diffused at the lower major surface and into which the p-type regions 11, 1 to 6 are diffused at the upper major surface. In the case of an insulated-gate field-effect transistor, the p-n junction 20 may constitute the drain junction formed by an annular p-type drain region 11 which extends around a central p-type source region and an intermediate channel region of the transistor, and the body portion 12 may be a high resistivity n-type epitaxial layer on a highly-doped n-type substrate 13 to which the p-type source region may be shortcircuited in known manner.

In the case of a bipolar transistor, the p-n junction 20 constitutes a base-collector junction of the transistor, the region 11 being the p-type base region which is provided in a high resistivity n-type epitaxial layer 12 on a highly-doped n-type substrate 13. The electrodes A and B are base and collector terminals respectively, of the transistor, and at least one highly-doped n-type emitter region having its own electrode is provided in the base region 11. However, the main p-n junction 20 may even be one blocking junction of a thyristor structure. In this latter case, the FIG. 1 structure is modified to have, for example, a high resistivity n-type substrate 12 into which p-type regions 11 and 13 may be diffused to form two oppositely-located blocking p-n junctions, the p-type region 13 constituting the anode of the thyristor while an n-type cathode emitter is provided in the p-type base region 11.

The series of concentric annular regions 1 to 6 serves to increase the breakdown voltage of the p-n junction 20 by widening the spread of the depletion layer 30 along the body surface so as to reduce the associated electrostatic field adjacent the surface to a value less than that of the critical field for electron-hole pair generation by avalanche breakdown. It has been found that a peak electrostatic field occurs in the depletion layer 30 adjacent the outer bottom corner 20' of the active device region 11 and/or adjacent the outer bottom corner 21' etc. of the inner annular region(s) 1 etc. This peak electrostatic field results from curvature of the equipotential surfaces adjacent these corners, especially when the regions 11, 1, etc. and the junctions 20, 21, etc. are of shallow depth, e.g. less than 10 micrometers. If the annular regions 1 to 6 are of known configuration, the breakdown voltage of the main junction 20 may then be limited by avalanche breakdown from one of these peaks.

In accordance with the present invention, this peak electrostatic field is reduced, so increasing the breakdown voltage by having one or more wider annular regions (e.g. regions 1, 2 and 3 in FIG. 1) adjacent the active device region 11. The reduction in the peak field adjacent the corners 20', 2', etc. is thought to result from the field-lines being stretched apart by the increased width of the inner annular regions (e.g. regions 1, 2 and 3 in FIG. 1). The annular regions (e.g. regions 4, 5 and 6) which are remote from the active device region 11 are of narrower width, as illustrated in FIG. 1. This is useful in reducing the surface area required to accommodate the total annular region system, especially where the spacing of the annular regions 1 to 6 increases with remoteness from the active device region 11, and it has been found that, contrary to simple theory, relatively small changes in the spacing of these narrower outer annular regions (e.g. regions 4, 5 and 5 of FIG. 1) can have a significant effect in reducing the electrostatic field at the junctions 20, 21, 22 etc. of the active device region 11 and wider inner annular regions (e.g. regions 1, 2 and 3).

It should be noted that FIG. 1 is not drawn to scale and that the proportions and especially the thickness/depth of various portions of the drawing have been exaggerated or reduced for the sake of clarity and convenience in the drawing. The precise number, widths and spacings of the annular regions depend on the desired breakdown voltage and the depths of the regions, and these are chosen as appropriate to the type of device. By way of illustration for FIG. 1, Table 1 gives an example of suitable widths (w) and spacings (d) in micrometers for a concentric arrangement of six p-type annular regions 1 to 6 for a device having an operating voltage of about 500 volts across the main p-n junction 20, the regions 11 and 1 to 6 being diffused to a depth of 3.25 micrometers and having a surface doping concentration of $7 \times 10^{18}$ cm$^{-3}$, the body portion 12 having a doping concentration of $2.5 \times 10^{14}$ cm$^{-3}$ and a thickness of 44 micrometers.

TABLE 1

| Spacing/Width | Micrometers |
| --- | --- |
| d(1) | 2;7 |
| w(1) | 25;20 |
| d(2) | 2;7 |
| w(2) | 15;10 |
| d(3) | 3;8 |
| w(3) | 15;10 |
| d(4) | 4;9 |
| w(4) | 10;5 |
| d(5) | 5;10 |
| w(5) | 10;5 |
| d(6) | 7;12 |
| w(6) | 10;5 |
| d(x) | 25;30 |
| w(x) | 10;5 |

In the second column of Table 1 the first value is the actual spacing or width of the regions in the final device assuming a lateral diffusion of about 2.5 micrometers for the regions 1 to 6, 11 and 14 in the body portion 12, whereas the second value relates to the dimensions of the mask 18 and its windows through which the regions 1 to 6, 11 and 14 were diffused.

In the example of Table 1, the width w(1) of the innermost annular region 1 is more than seven times its depth, more than twelve times the spacing d(1) of the region 1 from the active device region 11 and more than twice the width w(6) of the outermost annular region 6. The regions 4, 5 and 6 form an outer group of annular regions having the same width as each other, and the regions 2 and 3 form an inner group having the same larger width as each other. The innermost region 1 is even wider than the regions 2 and 3. The spacing d(4), d(5), d(6) between annular regions 4, 5 and 6 remote from the active device region 11 is larger than the spacing d(1) between the active device region 11 and the innermost region 1 but less than a third of the width w(1) of the wide innermost region 1. The spacing d(4), d(5), d(6) between annular regions 3, 4, 5 and 6 which are remote from the active device region 11 increases progressively in accordance with the remoteness from the active device region 11. The regions 1 and 2 have the same spacing d(2) from each other as the spacing d(1) between the active region 11 and the innermost annular region 1, and this spacing d(1), d(2) corresponds to the minimum reliably-reproducible separation distance between the diffused regions 11, 1 and 2.

Figure 2:
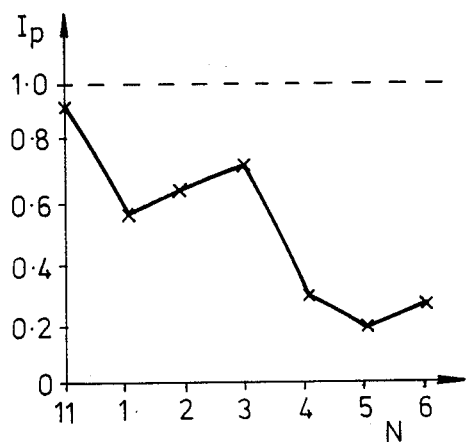
FIG. 2 is a graph of the hole avalanche integral Ip against the number N of each of the annular regions (1 to 6) of one particular example of the device of FIG. 1.

FIG. 2 provides an illustration of avalanche breakdown performance obtained by subjecting the example of Table 1 to a numerical analysis of the electrostatic field and floating potentials associated with each annular region 1 to 6 as a function of the reverse-bias potential of the main junction 20. The numerical analysis was carried out with the aid of a computer employing a finite difference algorithm using routines such as those described by H. L. Stone in the Journal of the Society for Industrial and Applied Mathematics (SIAM) on Numerical Analysis, Vol. 5, (1968), pages 530 to 552. Depletion region logic such as described by U. A. K. Temple and M. S. Adler in I.E.E.E. Transactions on Electron Devices, Vol. ED-22, No. 10, (1975), pages 910 to 916, was used to avoid time-consuming complications of evaluating exponential functions to obtain carrier concentrations which are not generally significant to off-state analysis. The floating potential regions were treated in a similar manner to that described by M. S. Adler, U. A. K. Temple, A. P. Ferro and R. C. Rustay in I.E.E.E. Transactions on Electron Devices, Vol. ED-24, No. 2, (1977), pages 107 to 113, i.e. the entire junction boundary of each region is searched individually after each iteration to determine the point of minimum reverse bias or maximum forward bias of that region and the potential of that region is then adjusted so that carrier injection through that point of minimum reverse bias or maximum forward bias is only just prevented. Having established in this manner a computer model of the potential distribution of the total concentric region arrangement for a given reverse bias of the main junction 20, the electrostatic field lines passing through the field peak of each region were determined, and avalanche integrals (such as described by R. van Overstraeten and H. de Man in Solid State Electronics, Vol. 13, (1970), pages 583 to 608) were evaluated along these field lines. The actual algorithm used is not important to the understanding of the present invention and so no further details are given in the present specification.

Avalanche integrals less than or at most equal to unity are required for a safe design avoiding avalanche breakdown at the maximum reverse bias voltage. When analyzing breakdown performance of the annular region system only the hole avalanche integral Ip computed from the field peak within each annular region need be considered, as this is a much stronger function of electrostatic field than the electron avalanche integral In. Furthermore if In equals 1.0, then Ip also equals 1.0; if In is less than 1.0, then Ip is also less than 1.0; or if In is greater than 1.0, then Ip is also greater than 1.0.

FIG. 2 shows a plot of the avalanche integral Ip (computed in this manner for the example described above) as a function of the different p-type regions having reference numbers 11,1,2,3,4,5 and 6 in FIGS. 1 and 2. The widths (w) and spacings (d) of the various regions which have a depth of 3.25 micrometers are given in Table 1. The reverse-bias voltage across the p-n junction 11 was 550 volts. It can be seen from FIG. 2 that the highest hole avalanche integral in this region system is associated with the active device region 11 and main junction 20, but this highest hole avalanche integral (about 0.9) is less than the critical 1.0 value for avalanche breakdown.

Figure 3:
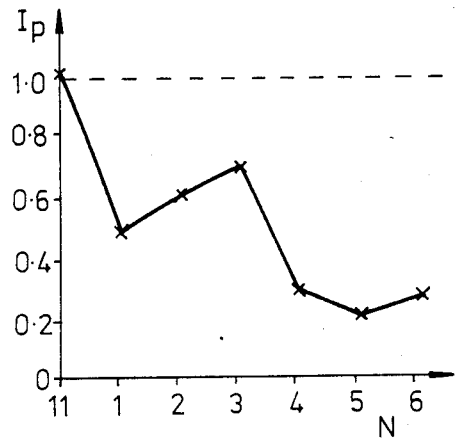
FIG. 3 is a graph similar to that of FIG. 2, but with respect to a modified example of the device of FIG. 1.

FIG. 3 is a similar plot with 550 volt reverse-bias, but for a modified example of FIG. 1. This modified example has the same region depth and the same values of d(1) to d(6), d(x), w(2) to w(6), and w(x) as in Table 1, but the width w(1) of the innermost annular region 1 is reduced to 15 micrometers (10 micrometers width for the mask window) instead of the previous 25 micrometers. The inner regions 1, 2 and 3 in this modified example therefore form one group of wide annular regions having the same width as each other. As can be seen by comparing FIGS. 2 and 3, this reduced width of the wide innermost annular region 1 increases the hole avalanche integral Ip for the active device region 11 and main junction 20 where this avalanche integral is now slightly greater than the critical 1.0 value. Analysis of the computer model suggests that this increase in avalanche integral is associated with a slight increase in curvature of the equipotential lines adjacent the outer bottom corner 20' of the junction 20. The device structure of FIG. 3 has a breakdown voltage lower than 550 volts, but the avalanche integral increase is maintained sufficiently small by the larger width of regions 1, 2 and 3 compared with regions 4, 5 and 6 that the device may still be operated at voltages up to about 500 volts. However, the structure of FIG. 3 is less advantageous than that of FIG. 2 (Table 1) because with the increased avalanche integral it may be more susceptible to premature breakdown due to effects which charge-states in the insulating layer 18 may have on the electrostatic field in the underlying depletion layer or to the effects of manufacturing tolerances in defining the regions. It will therefore be preferable to operate the device having the annular region system of FIG. 3 at a slightly lower voltage than that of FIG. 2.

In an annular region system not in accordance with the present invention and having all the regions 1 to 6 of the same width (10 micrometers) as each other and with the same depth (3.25 micrometers), the hole avalanche integral Ip adjacent the main junction 20 increases to greater than unity with even lower applied reverse bias voltages. Thus, in this case avalanche breakdown occurs at a lower voltage in spite of maintaining an increased spacing of the annular regions with distance from the active device region 11. The numerical analysis indicates that the increase in avalanche integral Ip in this case results from a peak field associated with curvature of the equipotential lines adjacent the bottom outer corners 20′, 21′, etc. of the inner junctions 20, 21 etc.

It will be evident that many modifications are possible within the scope of this invention. Thus, for example in the case of a power rectifier diode the rectifying junction of the diode may be formed by a metal-semiconductor Schottky contact to the body portion 12 and this junction may be bounded at its edge by an annular guard region 11 which constitutes the active device region of said opposite conductivity type.

Higher voltage devices may be manufactured using a higher resistivity body portion 12 and by adding even wider inner annular regions adjacent the active device region. Thus, a device having a breakdown voltage of at least 1,000 volts may have a body portion with a doping concentration of $10^{14}$ cm$^{-3}$ and a thickness of at least 90 micrometers, and there may be between ten and fifteen annular regions 1,2 etc. having spacings and widths in accordance with the invention, of which at least one innermost annular region may be as much as fifteen or more times as wide as the spacing d(1) from the active device region 11 and as much as six or more times as wide as outermost annular regions. The precise number, widths and spacing of these annular regions 1,2 etc. in accordance with the invention can be optimized for 1,000 volt operation even with such shallow depths of 3 or 5 micrometers for the active device region 11 and annular regions 1,2 etc. In some devices, in addition to providing wider inner annular regions between the active device region and narrow outer annular regions, it may be acceptable or even desirable to provide a wider annular region between two of these narrow outer annular regions in order to reduce the field at that location.

It will also be evident that the conductivity types of all the regions of the device may be reversed to form opposite conductivity type devices. Furthermore semiconductor materials other than silicon may be used for the devices, although allowance must then be made for different critical field strengths for avalanche breakdown in such other semiconductor materials. Instead of an insulating layer on the body surface, the regions 11, 1 to 6, and 14 may be passivated with a semi-insulating layer or a combination of insulating and semi-insulating layers.

I claim:

1. A semiconductor device comprising a semiconductor body having a portion of one conductivity type adjoining a major surface of the body, an active device region of the opposite conductivity type also adjoining said major surface and forming with said portion a main p-n junction which terminates at said major surface and is operated under reverse bias in at least one mode of operation of the device, and at least three annular regions of said opposite conductivity type extending around said active device region, which annular regions also adjoin said major surface and form with said portion auxiliary p-n junctions located within the spread of a depletion layer from the reverse-biased main p-n junction so as to increase the breakdown voltage of the main p-n junction, the spacing between two outer annular regions which are remote from the active device region being larger than the spacing between the active device region and the inner annular region which is adjacent the active device region, said active device region and said annular regions being more highly doped than said portion of the body, characterised in that the inner annular region which is adjacent the active device region is wider than said two outer annular regions which are remote from the active device region.

2. A semiconductor device as claimed in claim 1, further characterized in that the width of said inner annular region is as least twice the width of at least one of the outer annular regions.

3. A semiconductor device as claimed in claim 1 or claim 2, further characterized in that the width of said inner annular region is at least six times the spacing of said inner annular region from the active device region.

4. A semiconductor device as claimed in claim 1 or 2, further characterized in that the width of said inner annular region is more than seven times the depth of said inner annular region.

5. A semiconductor as claimed in claim 1 or 2, further characterized in that the annular regions comprise at least one group of at least two successive annular regions which have the same width as each other in the group.

6. A semiconductor device as claimed in claim 5, further characterized in that between the active device region and the group of annular regions of the same width there is at least one innermost annular region which is wider than the regions of said group.

7. A semiconductor device as claimed in claim 1 or 2, further characterized in that the width of the inner annular region is larger than the spacing between said two outer annular regions remote from the active device region.

8. A semiconductor device as claimed in claim 7, further characterized in that there are at least two inner annular regions near the active device region which have the same spacing from each other as the spacing between the active device region and the innermost annular region.

9. A semiconductor device as claimed in claim 1 or 2, further characterized in that the spacing between outer annular regions which are remote from the active device region increases progressively in accordance with remoteness from the active device region.

* * * * *